United States Patent
Nicol et al.

(10) Patent No.: US 7,139,526 B2
(45) Date of Patent: Nov. 21, 2006

(54) VARIABLE HIGH POWER AMPLIFIER WITH CONSTANT OVERALL GAIN FOR A SATELLITE COMMUNICATION SYSTEM

(75) Inventors: Eric Nicol, San Pedro, CA (US); John E. Eng, Buena Park, CA (US)

(73) Assignee: The Boeing Company, Chicago, IL (US)

( * ) Notice: Subject to any disclaimer, the term of this patent is extended or adjusted under 35 U.S.C. 154(b) by 545 days.

(21) Appl. No.: 10/431,903

(22) Filed: May 8, 2003

(65) Prior Publication Data

US 2004/0224635 A1    Nov. 11, 2004

(51) Int. Cl.
H04B 7/185 (2006.01)
(52) U.S. Cl. .............. 455/13.4; 455/12.1; 455/427; 370/316; 370/318
(58) Field of Classification Search .......... 455/12.1, 455/13.1–13.4, 427–430, 522; 370/316, 370/318
See application file for complete search history.

(56) References Cited

U.S. PATENT DOCUMENTS

| | | | |
|---|---|---|---|
| 4,160,288 A | * | 7/1979 | Stuart et al. ............ 363/41 |
| 6,035,181 A | * | 3/2000 | Gross .................. 455/127.2 |
| 6,229,262 B1 | * | 5/2001 | Hulsey et al. ............ 315/9 |
| 2002/0164950 A1 | * | 11/2002 | Chu et al. ............. 455/13.4 |
| 2003/0134595 A1 | * | 7/2003 | DiCamillo et al. ...... 455/13.4 |

* cited by examiner

Primary Examiner—Edward F. Urban
Assistant Examiner—Raymond S. Dean
(74) Attorney, Agent, or Firm—Ostrager Chong Flaherty & Broitman P.C.

(57) ABSTRACT

A power control system (12) for a satellite (10 includes a high power amplifier circuit (28) that receives a saturated power output adjustment signal. The amplifier circuit (28) includes a programmable circuit (70). An electronic power conditioner (56) is coupled to the programmable circuit (70) and is configured to reset an operating set-point of said high power amplifier circuit (28) in response to the saturated power output adjustment signal. A high power amplifier (46) has a variable output power range and amplifies a received signal in response to change in the operating set-point. A channel amplifier (44) is coupled to the programmable circuit (70) and is configured to gain offset the received signal in response to change in the operating set-point.

19 Claims, 2 Drawing Sheets

VARIABLE HIGH POWER AMPLIFIER WITH CONSTANT OVERALL GAIN FOR A SATELLITE COMMUNICATION SYSTEM

RELATED APPLICATION

The present invention is related to U.S. patent application Ser. No. 10/365,359 entitled "ON ORBIT VARIABLE POWER HIGH POWER AMPLIFIERS FOR A SATELLITE COMMUNICATIONS SYSTEM", which is incorporated by reference herein.

TECHNICAL FIELD

The present invention relates generally to communication satellites, and more particularly, to a system and method of controlling saturated output power of a power control system for such satellites.

BACKGROUND ART

Communication satellite payloads typically use high power amplifiers to increase power of received signals. The high power amplifiers are grouped together in redundancy rings, such that each high power amplifier within the ring has the same operating frequency range, bandwidth, and output power. For example, a commercial satellite may have forty 32 Ku-Band 120 W traveling wave tube amplifiers, 24 C-Band 40 W traveling wave tube amplifiers, and 38 90 W Ka-Band traveling wave tube amplifiers. Each high power amplifier is required to meet down link power or effective isotropic radiated power (EIRP) requirements equivalent to adjacent high power amplifiers contained within a redundancy ring. However, different paths through the redundancy ring have varying amounts of loss and not all of the high power amplifiers have identical EIRP requirements. Therefore, extra power is provided to high power amplifiers that have lower EIRP requirements. This is not power efficient.

Additionally, current high power amplifiers are limited in that they are designed and manufactured for one specific performance application. A performance application may be associated with providing service to a specific service area or serving or providing backup to a particular business service plan. Differing performance applications require different output RF power levels.

In conventional satellite payloads a high power amplifier typically includes a power supply that monitors cathode current of a high power amplifier and adjusts anode voltage to maintain a constant cathode current via an analog feedback loop. Over time, as a cathode of the high power amplifier degrades, the power supply compensates for this change by adjusting anode voltage to maintain a constant cathode current for a single designed performance application.

U.S. patent application entitled "On Orbit Variable Power High Power Amplifiers for a Satellite Communications System" provides a power system for a satellite that determines minimum EIRP for a high power amplifier and adjusts saturated power output of the high power amplifier to the minimum EIRP, thereby reducing power consumption of the system. Reducing the amount of power consumed by various components is desired since it not only conserves energy but also allows additional transponders to be placed upon a satellite to generate additional revenue.

Unfortunately, although, the above stated application provides a high power amplifier with variable output power that may be externally adjusted when in orbit it does not provide a technique for maintaining constant overall gain of the amplifier, thus also limiting its use for multiple performance applications. For example, when RF power of a high power amplifier, such as a flexible traveling wave tube as used in the stated application, is increased by a factor of two (3 dB), gain of the amplifier can increase by a factor of thirty-two (15 dB). Magnitude difference of this gain change is too large to handle in an analog environment and as such limits and potentially prevents the high power amplifier from being used in multiple performance applications.

It would therefore be desirable to provide a high power amplifier system that has reduced operating power consumption, that has an externally controllable variable RF power output, and that is capable of being used for multiple performance applications.

SUMMARY OF THE INVENTION

The present invention provides a power control system for satellites. The power control system includes a high power amplifier circuit that receives a saturated power output adjustment signal. The amplifier circuit includes a programmable circuit. An electronic power conditioner that is coupled to a programmable circuit and is configured to reset an operating set-point of the high power amplifier circuit in response to the saturated power output adjustment signal. A high power amplifier has a variable output power range and amplifies a received signal in response to change in the operating set-point. A channel amplifier is coupled to the programmable circuit and is configured to gain offset the received signal in response to change in the operating set-point.

One of several advantages of the present invention is that it provides a high power amplifier that is able to be externally controlled to maintain overall gain and efficiency, allowing the high power amplifier to be flexed over a RF output power dynamic range. In so doing, the present invention provides a high power amplifier that is capable of being used in multiple performance applications. In maintaining overall gain and efficiency the present invention saves on power consumption.

Another advantage of the present invention is that it provides a controllable high power amplifier that is capable of being applied in multiple performance applications, thereby allowing a high power amplifier to be pre-built without knowledge of specific output power performance specifications for a particular application. Pre-building of high power amplifiers decreases delivery time of high power amplifiers and thus delivery time of a payload, since amplifier delivery times commonly have the longest delay in assembly of a payload.

Furthermore, the present invention reduces the amount of power consumed by a high power amplifier circuit by controlling the saturated output power level of a high power amplifier therein. In reducing the amount of power consumed in the high power amplifiers, the overall size of the spacecraft power system may be reduced or additional revenue generating transponders may be deployed on a satellite. Also, in controlling the saturation output power level, the present invention provides more DC power reduction than merely backing off drive power to the high power amplifiers.

The present invention itself, together with further objects and attendant advantages, will be best understood by reference to the following detailed description, taken in conjunction with the accompanying drawing.

BEST MODES FOR CARRYING OUT THE INVENTION

Figure 1:
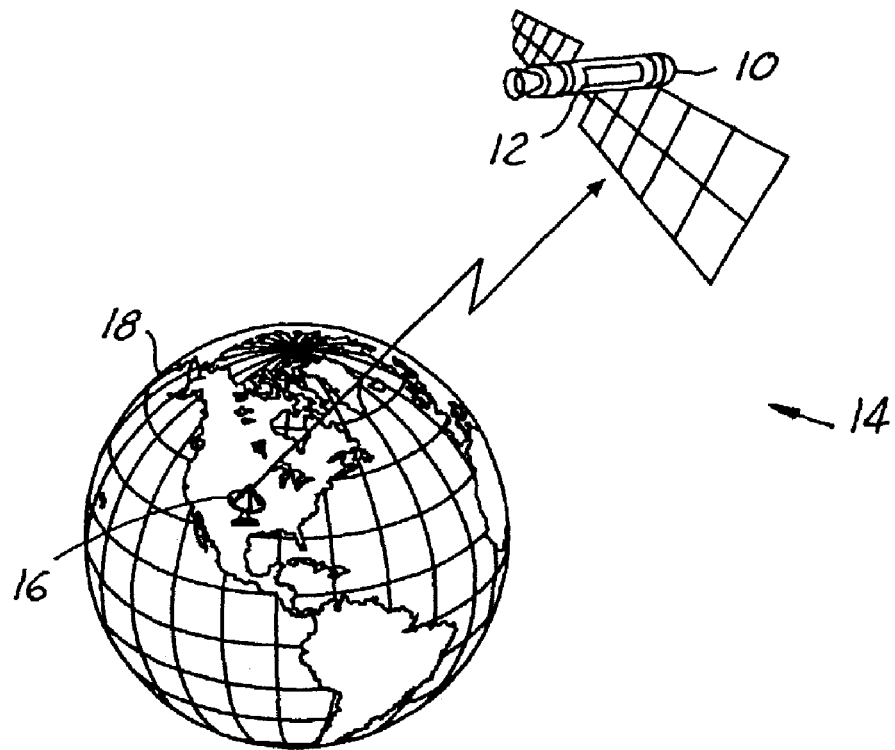
FIG. 1 is an elevational view of a satellite utilizing a power control system in accordance with an embodiment of the present invention.

In the following figures the same reference numerals will be used to identify the same components. While the present invention is described with respect to a system and method of controlling saturated output power of a power control system for a satellite, the present invention may be adapted for various high power amplifier applications known in the art. It should be understood that the present invention is applicable to various types of high power amplifiers as well as various numbers of high power amplifiers. Also, the present invention may be employed in groups or rings of high power amplifiers.

In the following description, various operating parameters and components are described for one constructed embodiment. These specific parameters and components are included as examples and are not meant to be limiting.

Referring now to FIG. 1, an elevational view of a satellite 10 utilizing a power control system 12 in accordance with an embodiment of the present invention is shown. The satellite 10 includes a satellite communication system 14 having the power control system 12 therein. The communication system 14 communicates with a ground station 16 on earth 18.

Figure 2:
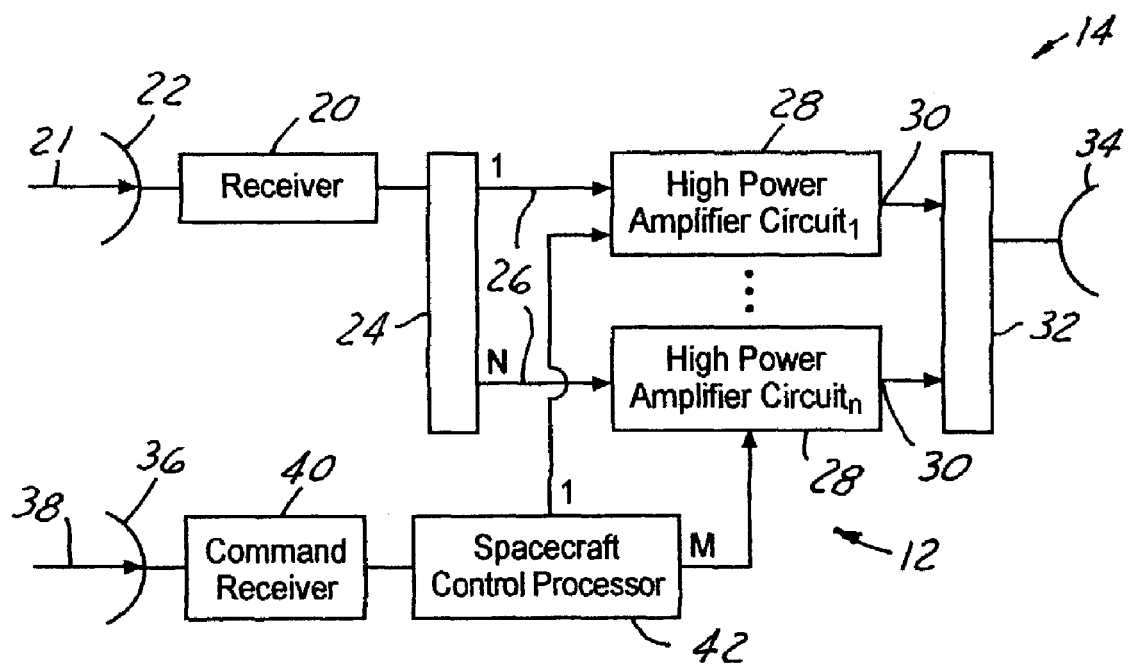
FIG. 2 is a simplified block diagrammatic view of a satellite communication system having the power control system in accordance with an embodiment of the present invention.

Referring now to FIG. 2, a simplified block diagrammatic view of the communication system 14 having the power control system 12 in accordance with an embodiment of the present invention is shown. The communication system 14 includes a receiver 20 that receives communication signals 21, via a receive antenna 22. Receiver 20 is coupled to switches and filters 24 that process the received communication signals 21 in a conventional manner. The switches and filters 24 divide the received signals 21 into various signal paths 26. Each of the signal paths 26 has a high power amplifier circuit 28 that has a variable power output 30. The amplifier circuits 28 are part of the power control system 12 and amplify the received signals 21. An output multiplexer 32 includes switches (not shown) and is coupled to the amplifier circuits 28. The multiplexer 32 receives the amplified received signals, which in turn are transmitted via an antenna 34.

The communication system 14 also has a command antenna 36. The command antenna 36 receives command signals 38 from the ground station 16. The command antenna 36 is coupled to a command receiver 40, and ultimately to a spacecraft control processor or controller 42. The controller 42 is also part of the power control system 12. The spacecraft control processor 42 may be coupled to various components including the amplifier circuits 28.

The controller 42 is preferably microprocessor based such as a computer having a central processing unit, memory (RAM and/or ROM), and associated input and output buses. The controller 42 may be a portion of a central main control unit, or may be a stand-alone controller as shown.

Figure 3:
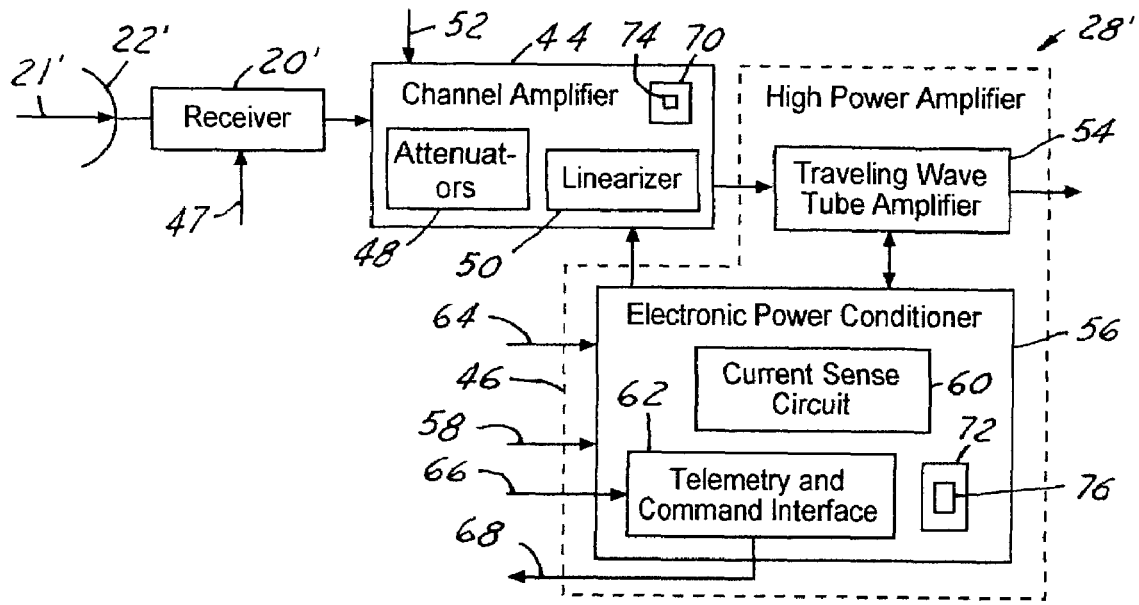
FIG. 3 is a detailed block diagrammatic view of a high power amplifier circuit in accordance with an embodiment of the present invention.

Referring now to FIG. 3, a detailed block diagrammatic view of a high power amplifier circuit 28' in accordance with an embodiment of the present invention is shown. Similar to the amplifier circuit 28, the amplifier circuit 28' receives communication signals 21' from a receiver 20', via an antenna 22. The amplifier circuit 28' amplifies and processes the communication signals 21' through use of a channel amplifier 44 and a high power amplifier 46. The receiver 20' may include a command input 47. Each amplifier circuit 28' may have any number of channel amplifiers, high power amplifiers, and power conditioners.

The channel amplifier 44 adjusts gain of the amplifier circuit 28'. The channel amplifier 44 includes one or more attenuators 48 and a linearizer 50. The attenuators 48 adjust gain offset of the received signals. The linearizer 50 is coupled within the channel amplifier 44 and adjusts phase and gain compression of the received signals. The linearizer 50 may be part of the channel amplifier 44, as shown, or may be a separate stand-alone device. The channel amplifier 44 may also include a command input 52 that may be coupled to the command receiver 40 or to the controller 42.

The power amplifier 46 is coupled to the linearizer 50, has an anode voltage operating range, and amplifies the received signals 21'. In one embodiment of the present invention, the power amplifier 46 has an output power range that is approximately equal to 3 dB. The power amplifier 46 may be one of various types of high power amplifiers and include amplifiers, such as a traveling wave tube amplifier 54, as shown, or a solid-state power amplifier (not shown). Each of the high power amplifiers 46 has a minimum isotropic radiated power output. The minimum effective isotropic radiated power varies within rings or groupings of the high power amplifiers 46. The saturated power output of the high power amplifiers 46 within groups of high power amplifiers may be reduced on an individual basis to reduce the amount of power consumption for the satellite 10. For a further detailed explanation on adjusting saturated output power on power amplifiers to a minimum effective isotropic radiated power see U.S. patent application entitled, "On Orbit Variable Power High Power Amplifiers for a Satellite Communications System" that is incorporated by reference herein.

The power amplifier 46 includes an electronic power conditioner 56 that is coupled within the power amplifier 46 and to the channel amplifier 44 and adjusts anode voltage of the power amplifier 46 in response to a command signal or a saturated power output adjustment signal 58. The power conditioner 56, although shown as being an integral part of the power amplifier 46 may be separate from the power amplifier 46.

The power conditioner 56 includes a current sense circuit 60 that adjusts anode voltage of the high power amplifier 46 to maintain a constant cathode current at a predetermined level. The power conditioner 56 may also maintain a constant cathode current through the high power amplifier 46 via a servo loop (not shown), as known in the art. The power conditioner 56 has a telemetry and command interface 62 that may be part of the controller 42. Telemetry and command interface 62 may also act as a controller in and of itself and be part of the channel amplifier 44, part of the controller 42, or part of the power conditioner 56. Power conditioner 56 includes a DC power input 64 that is used to supply power to the power amplifier 46. The power conditioner 56 has a command input 66 and a telemetry output 68.

The power conditioner 56 includes a programmable circuit 70. Although, the programmable circuit 70 is shown as being an integral part of the power conditioner 56 it may be part of other devices, such as the channel amplifier 44. Also, any number of programmable circuits may be utilized within the amplifier circuit 28', even though only one is shown in FIG. 3. The programmable circuit 70 may be in the form of a programmable read only memory, a field programmable gate array, an application specific integrated circuit, a programmable logic device, or some other programmable circuit known in the art.

In one embodiment of the present invention, the programmable circuit 70 includes a look-up table 72, containing various parameters, such as gain, offset, set-point, anode voltage, cathode current, and phase and their respective relationship to each other for a plurality of complementary states of associated output saturated power. The table 72 may be established during and from ground testing. A sample look-up table is shown below. Any number of look-up tables may be utilized.

Figure 4:
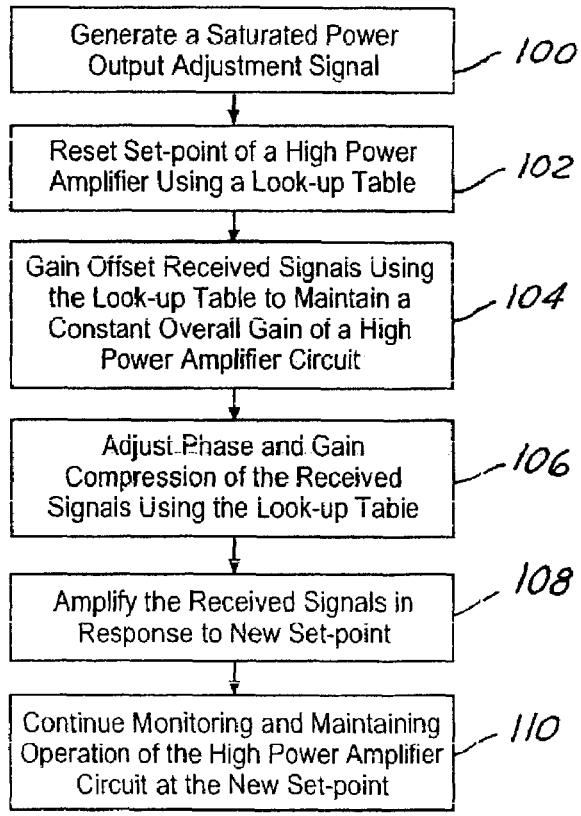
FIG. 4 is a logic flow diagram illustrating a method of operating a satellite having a plurality of high power amplifier circuits in accordance with an embodiment of the present invention.

Referring now to FIG. 4, a logic flow diagram illustrating a method of operating a satellite 10 having the high power amplifier circuits 28' in accordance with an embodiment of the present invention is shown. In the following method steps although multiple look-up tables are utilized, other similar techniques known in the art may be used to provide relationships between the above-stated parameters and determine appropriate related corresponding values or levels.

In step 100, a command signal is received by the controller 42 from the ground station 16. The controller 42 may receive a command signal from a satellite other than satellite 10 or may itself generate a command signal. The controller 42 or the command interface generates a saturated power output adjustment signal for the high power amplifier 46 in response to the command signal.

The command signal includes a new power level that is contained in a look-up table, such as look-up table 72, along with associated adjustment values for a corresponding state; table 1 below is a sample table that may be used.

TABLE 1

Example look-up table for flexible high power amplifier circuit with constant gain and linearity.

| State | Power level Watts | Cathode Current mAmps | Anode Voltage Range Volts | Gain Offset (dB) Attenuator 1 | Attenuator n | Gain Compression Compensation dB | Sat. Phase Compensation degrees |
|---|---|---|---|---|---|---|---|
| 1 | 50 | 52 | 50–350 | 15 | 11 | 2.3 | 32 |
| 2 | 60 | 64 | 50–350 | 12 | 10 | 2.2 | 33 |
| 3 | 70 | 78 | 50–350 | 10 | 9 | 2.0 | 36 |
| 4 | 80 | 92 | 200-500 | 8 | 8 | 2.1 | 37 |
| 5 | 90 | 103 | 200-500 | 6 | 7 | 2.2 | 39 |
| 6 | 100 | 113 | 200-500 | 4 | 6 | 2.3 | 42 |

The command signal may be in the form of a saturated power output adjustment signal and may be directly received by the power conditioner 56 or by the channel amplifier 44, rather than from the controller 42. The saturated power output adjustment signal contains a desired output power level for the power amplifier 46. The controller 42 flexes an output power range of the power amplifier 46 by signaling the power conditioner 56 with the saturated power output adjustment signal to adjust the cathode current regulation point of the traveling wave tube 54. The anode voltage is adjusted within an anode voltage range to provide the constant cathode current associated with that saturated output power state.

In step 102, the power conditioner 56 resets an operating set-point of the high power amplifier circuit 28' in response to the saturated power output adjustment signal through use of the look-up table 72. The power conditioner 56 determines an appropriate cathode current for a commanded output power in response to the saturated power output adjustment signal. The look-up table 72 includes a relationship between output power level and cathode current. The power conditioner 56 is capable of determining appropriate anode voltage for specified cathode current for a requested output power level of the traveling wave tube 54.

For the traveling wave tube amplifier 54, the anode voltage is used by the power conditioner 56 for power control. For other amplifiers, such as a solid-state power amplifier (not shown) the drain voltage of a field effect transistor may be used to control the saturated output power.

In step 104, the channel amplifier 44 gain offsets the received signals in response to the saturated power output adjustment signal through use of the look-up table 72. Overall gain offset for a particular power level may include adjustment of any of the attenuators 48. The look-up table 72 also contains a relationship between cathode current and nominal gain, such that as cathode current changes the channel amplifier 44 selects an appropriate gain for a current cathode current level. In gain offsetting the received signals the channel amplifier 44 compensates for the change in anode voltage to maintain an approximately constant overall gain of the power amplifier circuit 28'. For example, when the output power is increased or the anode voltage is increased the gain is decreased and vice versa.

In step 106, the linearizer 50 compensates for the cathode current adjustment by adjusting nominal saturated phase and gain compression of the received signals, for the new saturated power level, to aid in providing an adjustment to minimize distortion in the output power of the power amplifier 46. Linearizer settings are adjusted through use of the look-up table 72

In step 108, the traveling wave tube 54 amplifies the received signals in response to change in the cathode current.

In step 110, the amplifier circuit 28' continues monitoring and maintaining operation at the new set-point.

The above-described steps are meant to be an illustrative example; the steps may be performed synchronously, sequentially, simultaneously, or in a different order depending upon the application.

The present invention provides a power control system for a satellite that is capable of operating in multiple performance applications due to its ability to in orbit adjust output power of high power amplifier circuits while maintaining a constant overall gain. The present invention provides multiple look-up tables that are contained within the power amplifier circuits for appropriately adjusting gain, phase, gain compression, anode voltage, and cathode current in response to an output power command signal.

While the invention has been described in connection with one or more embodiments, it should be understood that the invention is not limited to those embodiments. On the contrary, the invention is intended to cover all alternatives, modifications, and equivalents, as may be included within the spirit and scope of the appended claims.

What is claimed is:

1. A power control system for a satellite comprising:
   at least one high power amplifier circuit receiving a saturated power output adjustment signal from a ground station and comprising:
   at least one programmable circuit;
   an electronic power conditioner coupled to said at least one programmable circuit and configured to reset an operating set-point of said high power amplifier circuit in response to said saturated power output adjustment signal;
   a high power amplifier having a variable output power range and amplifying a received signal in response to change in said operating set-point; and
   a channel amplifier coupled to said at least one programmable circuit and configured to gain offset said received signal in response to change in said operating set-point,
   wherein the programmable circuit includes a look-up table containing parameters for a plurality of complementary states of anode voltage, cathode current, and saturated power adjustment signal, and
   wherein said electronic power conditioner receives said the corresponding saturated power adjustment signal and adjusts said high power amplifier to have an adjusted anode voltage within an anode voltage range to provide a constant cathode current associated with a saturated output power state.

2. A system as in claim 1 wherein said electronic power conditioner in resetting said operating set-point resets set-point of a cathode current.

3. A system as in claim 1 wherein said electronic power conditioner in resetting said operating set-point resets set-point of an anode voltage.

4. A system as in claim 1 wherein said electronic power conditioner supplies power to said high power amplifier.

5. A system as in claim 1 wherein said electronic power conditioner maintains a constant cathode current through said high power amplifier via a servo loop.

6. A system as in claim 1 further comprising a cathode current sense circuit electrically coupled to said electronic power conditioner and adjusting an anode voltage of said high power amplifier to maintain a constant cathode current.

7. A system as in claim 1 wherein said electronic power conditioner maintains a constant cathode current through said high power amplifier at a predetermined level.

8. A system as in claim 1 wherein said high power amplifier has an anode voltage operating range.

9. A system as in claim 1 wherein said high power amplifier has an output power range that is approximately equal to 3 dB.

10. A system as in claim 1 wherein said at least one programmable circuit is selected from at least one of a programmable read only memory, a field programmable gate array, an application specific integrated circuit, and a programmable logic device.

11. A system as in claim 1 wherein said channel amplifier is coupled to a linearizer that compensates for phase and gain compression changes of said received signal in response to change is said operating set-point.

12. A system as in claim 1 wherein said channel amplifier in gain offsetting said received signal maintains an approximately constant overall gain of the said least one high power amplifier circuit.

13. A satellite system comprising:
    a receiver receiving at least one command signal from a around station;
    a controller generating a saturated power output adjustment signal in response to said at least one command signal; and
    a power control system having at least one high power amplifier circuit receiving a saturated power output adjustment signal and comprising:
    at least one programmable circuit;
    an electronic power conditioner coupled to said at least one programmable circuit and configured to reset an operating set-point of said high power amplifier circuit, in response to said saturated power output adjustment signal;
    a high power amplifier having a variable output power range and amplifying a received signal in response to change in said operating set-point; and
    a channel amplifier coupled to said at least one programmable circuit and configured to gain offset said received signal in response to change in said operating set-points,
    wherein the programmable circuit includes a look-up table containing parameters for a plurality of complementary states of anode voltage, cathode current, and saturated power adjustment signal, and
    wherein said electronic power conditioner receives said the corresponding saturated power adjustment signal and adjusts said high power amplifier to have an adjusted anode voltage within an anode voltage range to provide a constant cathode current associated with a saturated output power state.

14. A system as in claim 13 wherein said controller adjusts effective saturated power output of said high power amplifier to a minimum effective isotropic radiated power in response to said command signal.

15. A system as in claim 13 wherein said controller flexes an output power range of said high power amplifier by adjusting a cathode current of said high power amplifier within an anode voltage range.

16. A circuit as in claim 13 wherein said channel amplifier is coupled to a linearizer that compensates for phase and gain compression changes of said received signal in response to change in said operating set-point.

17. A circuit as in claim 13 wherein said channel amplifier in gain offsetting said received signal maintains an approximately constant overall gain of said at least one high power amplifier circuit.

18. A method of operating a satellite having a plurality of high power amplifier circuits, each of which having a high power amplifier, the method comprising:

receiving a command signal from a ground station and generating a saturated power output adjustment signal for at least one of the high power amplifiers;

resetting an operating set-point of at least one high power amplifier circuit in response to said saturated power output adjustment signal through use of a at least one programmable circuit within the high power amplifier circuits; and gain offsetting said received signal in response to change in said operating set-point through use of said at least one programmable circuit within he high power amplifier circuits, wherein the programmable circuit includes a look-up table containing parameters for a plurality of complementary states of anode voltage, cathode current, and saturated power adjustment signal, and wherein said resetting an operating set-point includes adjusting the high power amplifier circuit to have an adjusted anode voltage within an anode voltage range to provide a constant cathode current associated with a saturated output power state.

19. A method as in claim 18 wherein resetting an operating set-point of at least one high power amplifier circuit and wherein gain offsetting said received signal are performed through use of at least one look-up table.

* * * * *